(12) United States Patent
Peng

(10) Patent No.: US 8,412,762 B2
(45) Date of Patent: Apr. 2, 2013

(54) ERROR-CORRECTING METHOD USED IN DATA TRANSMISSION AND DECODING

(75) Inventor: Chiung-Ying Peng, Taipei (TW)

(73) Assignee: Princeton Technology Corporation, Taipei County (TW)

( * ) Notice: Subject to any disclaimer, the term of this patent is extended or adjusted under 35 U.S.C. 154(b) by 1343 days.

(21) Appl. No.: 12/110,912

(22) Filed: Apr. 28, 2008

(65) Prior Publication Data

US 2009/0112961 A1   Apr. 30, 2009

(30) Foreign Application Priority Data

Oct. 30, 2007 (TW) .............................. 96140742 A

(51) Int. Cl.
*G06F 11/00* (2006.01)
(52) U.S. Cl. ........................................... 708/530
(58) Field of Classification Search .................. 708/530
See application file for complete search history.

(56) References Cited

U.S. PATENT DOCUMENTS

2009/0185645 A1 *   7/2009   Watanabe ................. 375/343

FOREIGN PATENT DOCUMENTS

WO   WO 2007055008 A1 *   5/2007

* cited by examiner

*Primary Examiner* — Tan V. Mai
(74) *Attorney, Agent, or Firm* — Muncy, Geissler, Olds & Lowe, PLLC

(57) ABSTRACT

An error-correcting method used in decoding data transmission is disclosed. The error-correcting method is used for analyzing an error receiving data received from a receiving terminal and comprises: providing a first calculating formula for manipulation of the receiving data to generate the first sum; providing a second calculating formula for manipulation of the receiving data to generate the second sum; identifying the error position of the receiving data according to the result of dividing the second sum by the first sum.

13 Claims, 2 Drawing Sheets

ERROR-CORRECTING METHOD USED IN DATA TRANSMISSION AND DECODING

BACKGROUND

The invention relates to an error-correcting method used in decoding data transmission, and in particular to an error-correcting method capable of locating an error.

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

During data transmission, data received by a receiver may be different from data transmitted from a transmitter because of interference occurring during the transmission process. Accordingly, an error-correction procedure is required, so that the data received by the receiver can be corrected.

According to a conventional error-correction procedure, incorrect data received by the receiver is compared with correct data to identify a set of correct data similar to the incorrect data. The incorrect data is then corrected according to the correct data. According to the conventional procedure, considerable storage capacity is consumed by maintenance of a database. In addition, considerable computing resource is consumed during the comparing process.

Accordingly, an error-correcting method is needed to reduce required storage capacity and computing resources.

SUMMARY

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

An error-correcting method used in data transmission and decoding is provided, analyzing data received by a receiver. A first equation is provided for processing of the data to accordingly generate a first sum. A second equation is provided for processing of the data to accordingly generate a second sum. The second sum is divided with the first sum, and a position of an erroneous bit in the data is identified according to a result obtained from the division operation.

An error-correcting method used in data transmission and decoding is also provided, analyzing data received by a receiver. A first equation is provided for performing a first multiplication operation and a first XOR operation on the data to accordingly generate a first sum. A second equation is provided for performing a second multiplication operation and a second XOR operation on the data to accordingly generate a second sum. The second sum is divided with the first sum, and a position of an erroneous bit in the data is identified according to a result obtained from the division operation.

A method of data transmission and decoding is provided, transmitting original data from a transmitter to a receiver. The original data is encoded. The encoded original data is transmitted from the transmitter to the receiver as received data. A first equation is provided for processing of the received data to accordingly generate a first sum. A second equation is provided for processing of the received data to accordingly generate a second sum. The second sum is divided with the first sum, and a position of an erroneous bit in the data is identified according to a result obtained from the division operation. The erroneous bit of the received data is corrected. The received data is decoded to restore the original data.

BRIEF DESCRIPTION OF DRAWINGS

The invention can be more fully understood by reading the subsequent detailed description and examples with references made to the accompanying drawings, wherein.

DETAILED DESCRIPTION

One or more specific embodiments of the invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve specific developer goals, such as compliance with system-related and business-related constraints, which may vary from one implementation to another. Moreover, it should be appreciated that such a development effort might be complex and time consuming, but would nevertheless be a routine undertaking of design, fabrication, and manufacturing for those of ordinary skill having the benefit of this disclosure.

In the following detailed description, reference is made to the accompanying drawings which form a part hereof, shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the invention. The following detailed description is, therefore, not to be taken in a limiting sense. The leading digit(s) of reference numbers appearing in the figures corresponds to the figure number, with the exception that the same reference number is used throughout to refer to an identical component which appears in multiple figures. It should be understood that many of the elements described and illustrated throughout the specification are functional in nature and may be embodied in one or more physical entities or may take other forms beyond those described or depicted.

During a data transmission procedure, original data is encoded and sent to a receiver by a transmitter, and the data is then decoded, proofread, and corrected by the receiver. Here, original data comprising 752 bits is used as an example in describing an embodiment of an error-correcting method. It is to be understood that the invention is not limited to the embodiment.

Figure 1:
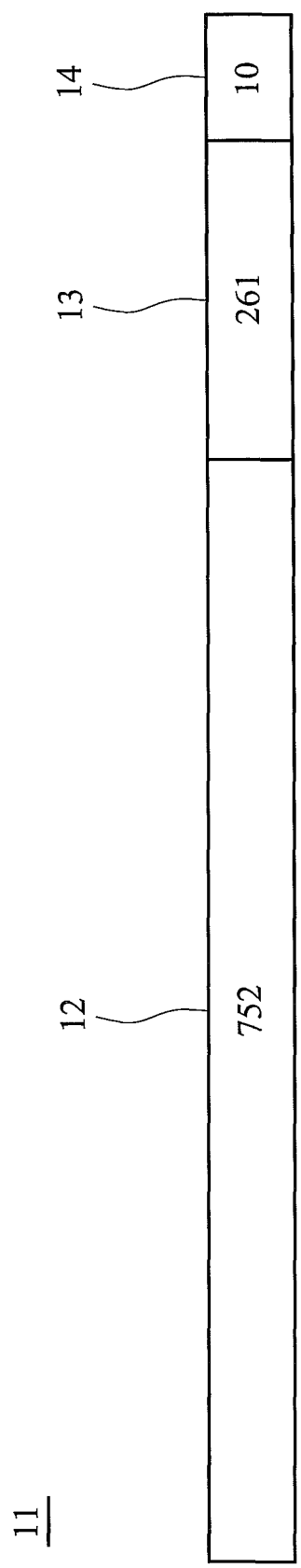
FIG. 1 illustrates a schematic view of an embodiment of a data structure of encoded data.

In the transmitter, the 752-bit original data is encoded, and 261 bits of zero value are appended to the 752-bit original data generate a 1013-bit encoded data, and a 10-bit proofread field is then appended to the 1013-bit encoded data generate a 1024-bit encoded data, accordingly. FIG. 1 illustrates a schematic view of an embodiment of a data structure of encoded data. As shown in FIG. 1, encoded data 11 comprises a 752-bit original data 12, a 261-bit zero data 13, and a 10-bit proofread field 14.

Two equations are provided for the error-correcting method, i.e., a first equation and a second equation.

The first equation is:

$$S_1 = C_0\alpha^{1023} + C_1\alpha^{1022} + C_2\alpha^{1021} + \ldots + C_{1022}\alpha + C_{1023}.$$

The second equation is:

$$S_2 = C_0(\alpha^{1023})^2 + C_1(\alpha^{1022})^2 + C_2(\alpha^{1021})^2 + \ldots + C_{1022}\alpha^2 + C_{1023}.$$

According to the equations, C represents the data received by a receiver (referred to as received data); C0 represents the first data bit within the received data; α represents an undesignated parameter.

Figure 2:
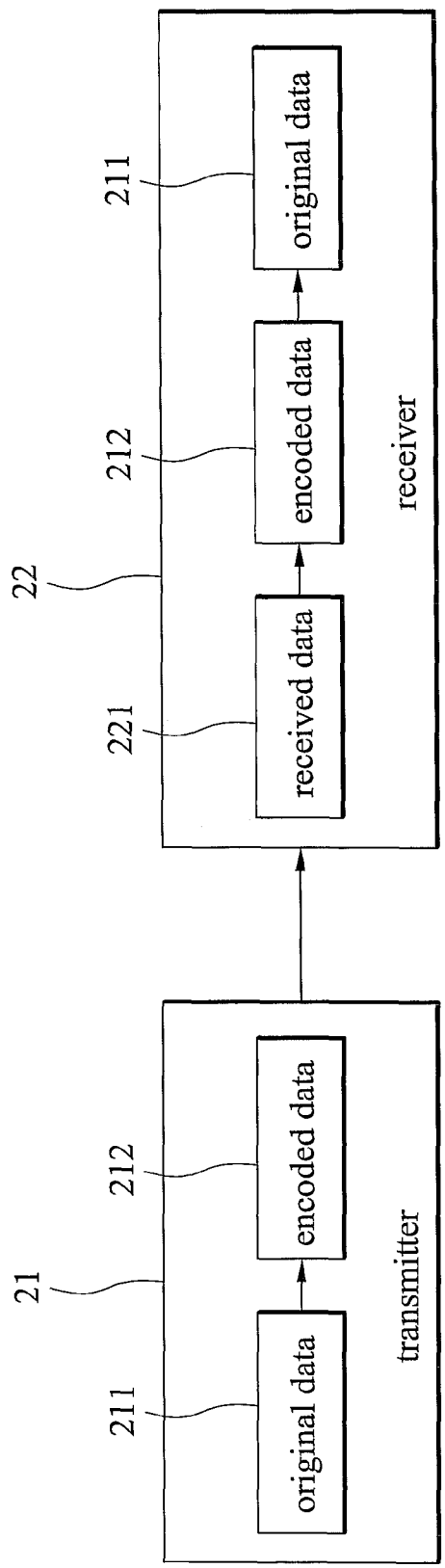
FIG. 2 illustrates a schematic view of an embodiment of data transmission.

FIG. 2 illustrates a schematic view of an embodiment of data transmission. As shown in FIG. 2, original data 211 is stored in transmitter 21, original data 211 is encoded to generate encoded data 212, the encoded data 212 is sent from a transmitter 21 to a receiver 22, and data received by the receiver 22 is referred to as received data 221. The received data 221 may be different from the original data 211 because of interference occurring during the data transmission procedure. By using the error-correcting method which implements the first equation and the second equation, the received data 221 can be restored to the encoded data 212, and the encoded data 212 can then be decoded to generate the original data 211.

According to the first equation, each bit of the received data is multiplied by an exponentiation $\alpha^n$, wherein α is a parameter, and n relates to a position of a corresponding bit. For example, the first bit $C^0$ is multiplied by $\alpha^{1023}$; the first bit $C_1$ is multiplied by $\alpha^{1022}$. After the multiplication operation, an XOR operation is performed for each bit. The result obtained from the XOR operation of the first equation is 0 when there is no erroneous bit in the received data arising from interference during data transmission.

According to the second equation, each bit of the received data is multiplied by an exponentiation $(\alpha^n)^2$, wherein α is a parameter, and n relates to a position of a corresponding bit. For example, the first bit $C_0$ is multiplied by $(\alpha^{1023})^2$; and the first bit $C_1$ is multiplied by $(\alpha^{1022})^2$. After the multiplication operation, an XOR operation is performed for each bit. The result obtained from the XOR operation of the second equation is 0 when there is no erroneous bit in the received data arising from interference during data transmission.

Accordingly, a result of a zero value is obtained from the calculation using the first equation and the second equation when there is no error in the received data arising from interference during data transmission, and result of a non-zero value is obtained from the calculation using the first equation and the second equation when there is an error in the received data arising from interference during data transmission.

For example, when the $1023^{th}$ bit is an erroneous bit, the result $S_1$ corresponding to the first equation is $S_1 = 0 + C_{1023}'$, and the result S2 corresponding to the second equation is $S_2 = 0 + C_{1023}'$. Accordingly, the result corresponding to the first equation equals to the result corresponding to the second equation, i.e., $S_1 = S_2$. For example, when the $1022^{th}$ bit is an erroneous bit, and the result $S_1$ corresponding to the first equation is $S_1 = 0 + C_{1023}'\alpha$, and the result $S_2$ corresponding to the second equation is $S_2 = 0 + C_{1023}'\alpha^2$. Accordingly, a result of dividing S2 by S1 (S2/S1) is α. According to the parameter α, it can be determined that $1022^{th}$ bit is an erroneous bit.

Similarly, when the $1021^{th}$ bit is an erroneous bit, a result of dividing S2 by S1 (S2/S1) is $\alpha^2$; when the $1020^{th}$ bit is an erroneous bit, and a result of dividing S2 by S1 (S2/S1) is $\alpha^3$. When the $1019^{th}$ bit is an erroneous bit, a result of dividing S2 by S1 (S2/S1) is $\alpha^4$. Accordingly, based on the result of dividing S2 by S1 (S2/S1), position of an erroneous bit can be determined. The erroneous bit is then corrected, and the encoded data 212 is accordingly generated. The encoded data 212 is then decoded to generate original data 211. The data transmission can be implemented in a BCH decoding system, and it is to be understood that the invention is not limited thereto.

According to the described method, when an erroneous bit exists, a data-correcting procedure is performed on an encoded data received by a receiver, and position of the erroneous bit can be determined. The described method is not implemented for a scenario in which a plurality of erroneous bits exists. According to the present invention, the required storage capacity and computing resources can be reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A computer-implemented error-correcting method used in data transmission and decoding, analyzing data received by a receiver, comprising:

providing, in a storage device, a first equation for processing of the data to accordingly generate a first sum, wherein the first equation comprises a plurality of XOR operations, according to the first equation, each bit of the data is multiplied by an exponentiation $\alpha^n$, wherein α is a parameter, and n relates to a position of a corresponding bit, and a multiplication result corresponding to the said each bit is processed by an XOR operation, a result of the XOR operation of the first equation is 0 when there is no erroneous bit in the data;

providing, in the storage device, a second equation for processing of the data to accordingly generate a second sum;

dividing, by a processor, the second sum with the first sum, and identifying a position of an erroneous bit in the data according to a result obtained from the division operation.

2. The error-correcting method of claim 1, wherein the second equation comprises a plurality of XOR operations, according to the second equation, each bit of the data is multiplied by an exponentiation $(\alpha^n)^2$, wherein α is a parameter, and n relates to a position of a corresponding bit, and a multiplication result corresponding to the said each bit is processed by an XOR operation.

3. The error-correcting method of claim 2, wherein a result of the XOR operation of the second equation is 0when there is no erroneous bit in the data.

4. The error-correcting method of claim 1, wherein the error-correcting method is implemented in a BCH decoding system.

5. The error-correcting method of claim 1, wherein the error-correcting method is implemented in a scenario in which only one erroneous bit exists in the data.

6. A computer-implemented error-correcting method used in data transmission and decoding, analyzing data received by a receiver, comprising:

providing, in a storage device, a first equation for performing a first multiplication operation and a first XOR operation on the data to accordingly generate a first sum, wherein the first equation comprises a plurality of XOR operations, and according to the first equation, each bit of the data is multiplied by an exponentiation $\alpha^n$, wherein α is a parameter, and n relates to a position of a corresponding bit, and a multiplication result corresponding to the said each bit is processed by an XOR operation, and a result of the XOR operation of the first equation is 0 when there is no erroneous bit in the data;

providing, in the storage device, a second equation for performing a second multiplication operation and a second XOR operation on the data to accordingly generate a second sum;

dividing, by a processor, the second sum with the first sum, and identifying a position of an erroneous bit in the data according to a result obtained from the division operation.

7. The error-correcting method of claim 6, wherein the second equation comprises a plurality of XOR operations, according to the second equation, and each bit of the data is multiplied by an exponentiation $(\alpha^n)^2$, wherein $\alpha$ is a parameter, and n relates to a position of a corresponding bit, and a multiplication result corresponding to the said each bit is processed by XOR operation.

8. The error-correcting method of claim 7, wherein a result of the XOR operation of the second equation is 0 when there is no erroneous bit in the data.

9. The error-correcting method of claim 6, wherein the error-correcting method is implemented in a BCH decoding system.

10. A method of data transmission and decoding, transmitting original data from a transmitter to a receiver, comprising:
   encoding the original data;
   transmitting the encoded original data from the transmitter to the receiver as received data;
   providing a first equation for processing of the received data to accordingly generate a first sum, wherein the first equation comprises a plurality of XOR operations, and according to the first equation, each bit of the data is multiplied by an exponentiation $\alpha^n$, wherein $\alpha$ is a parameter, and n relates to a position of a corresponding bit, and a multiplication result corresponding to the said each bit is processed by an XOR operation, wherein a result of the XOR operation of the first equation is 0 when there is no erroneous bit in the data;
   providing a second equation for processing of the received data to accordingly generate a second sum;
   dividing the second sum with the first sum, and identifying a position of an erroneous bit in the data according to a result obtained from the division operation;
   correcting the erroneous bit of the received data; and
   decoding the received data to restore the original data.

11. The method for data transmission and decoding of claim 10, wherein the second equation comprises a plurality of XOR operations, according to the second equation, and each bit of the data is multiplied by an exponentiation $(\alpha^n)^2$, wherein $\alpha$ is a parameter, and n relates to a position of a corresponding bit, and a multiplication result corresponding to the said each bit is processed by XOR operation, wherein a result of the XOR operation of the second equation is 0 when there is no erroneous bit in the data.

12. The method for data transmission and decoding of claim 10, wherein the method is implemented in a BCH decoding system.

13. The method for data transmission and decoding of claim 10, wherein the method is implemented in a scenario in which only one erroneous bit exists in the data.

* * * * *